United States Patent
Lefevre et al.

(10) Patent No.: US 11,683,024 B2
(45) Date of Patent: Jun. 20, 2023

(54) SWITCH CONTROL CLAMPING

(71) Applicant: Commissariat à l'Énergie Atomique et aux Énergies Alternatives, Paris (FR)

(72) Inventors: Guillaume Lefevre, Grenoble (FR); Gaëtan Perez, Grenoble (FR); Guillaume Piquet-Boisson, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/121,480

(22) Filed: Dec. 14, 2020

(65) Prior Publication Data

US 2021/0194466 A1 Jun. 24, 2021

(30) Foreign Application Priority Data

Dec. 19, 2019 (FR) ...................................... 1914876

(51) Int. Cl.
*H03K 3/012* (2006.01)

(52) U.S. Cl.
CPC .................................... *H03K 3/012* (2013.01)

(58) Field of Classification Search
CPC .................................. H03K 3/01; H03K 3/012
See application file for complete search history.

(56) References Cited

U.S. PATENT DOCUMENTS

| 2012/0086496 A1 | 4/2012 | Itou et al. |
| 2013/0200929 A1 | 8/2013 | Sawada et al. |
| 2016/0191047 A1* | 6/2016 | Yamamura ........... H03K 17/163 327/109 |

FOREIGN PATENT DOCUMENTS

WO WO 2012/165649 A1 12/2012

OTHER PUBLICATIONS

Preliminary Search Report and Written Opinion for French Application No. 1914876, dated Aug. 13, 2020.
[No Author Listed] ISO5851 High-CMTI 2.5-A and 5-A Isolated IGBT, MOSFET Gate Driver With Active Protection Features. Texas Instruments. Jun. 2015, 40 pages.
FR1914876, Aug. 13, 2020, Preliminary Search Report.

* cited by examiner

*Primary Examiner* — Diana J. Cheng
(74) *Attorney, Agent, or Firm* — Wolf, Greenfield & Sacks, P.C.

(57) ABSTRACT

A method of controlling a switch, including: a) applying a control signal to a control terminal of the switch, said control signal exhibiting at least one first switching between a switch turn-on control state and a switch turn-off control state; and b) applying a switch turn-off potential on said control terminal after a first delay starting at said first switching, the first delay being greater than the turn-off time.

16 Claims, 4 Drawing Sheets

SWITCH CONTROL CLAMPING

TECHNICAL BACKGROUND

The present disclosure generally relates to electronic devices and, more specifically, to switched-mode converters.

PRIOR ART

Switched-mode converters use one or a plurality of switches alternately set to the on and off states at a switching frequency. Switched-mode converters are used to deliver a voltage and/or a current from a power supply having voltage/current values different from the values of the voltage/current to be delivered. The power supply may be a DC voltage/current source, such as a battery or a photovoltaic sensor, or an AC source such as an alternator. In certain applications, the converter is an inverter delivering the voltage/current in AC form, typically three-phase, for example, to a motor or to an electric power distribution network.

SUMMARY

There is a need to improve the efficiency and the reliability of existing converters, in particular, of existing inverters.

An embodiment overcomes all or part of the disadvantages of known switch control methods.

An embodiment overcomes all or part of the disadvantages of switch control devices.

An embodiment overcomes all or part of the disadvantages of known converters, in particular of known inverters.

An embodiment provides a method of controlling a switch comprising:

a) applying a control signal to a control terminal of the switch, said control signal exhibiting at least a first switching between a switch turn-on control state and a switch turn-off control state, the switch switching to an off state within a turn-off time from the first switching; and b) applying a switch turn-off potential on said control terminal after a first delay starting at said first switching, the first delay being greater than the turn-off time.

According to an embodiment, the first switching forms an edge between a turn-on level and a turn-off level.

According to an embodiment:
the first switching marks the beginning of a first period during which said control signal is only in the turn-off control state;
a second period comprises alternations of the states of control of the turning off and the turning on of the switch; and
the first delay is longer than a cycle time of the alternations.

According to an embodiment, the first delay is shorter than 1% of a duration of the first period, preferably shorter than 0.2% of a duration of the first period, more preferably shorter than 0.05% of the first period.

According to an embodiment:
said control signal has, during said application of the turn-off potential, at least one second switching between the turn-off control state and the turn-on control state; and
said application of the turn-off potential is interrupted within a second delay starting at said second switching and shorter than the first delay, the second delay preferably being shorter than approximately 1 µs.

According to an embodiment:

said control signal exhibits, outside of said application of the turn-off potential, a third switching between the turn-off control state and the turn-on control state, the switch switching to an on state within a turn-on time from the third switching; and
the second delay is shorter than the turn-on time.

According to an embodiment:
said application of said control signal is performed by means of a link having a first impedance; and
during the implementation of said application of the turn-off potential, a second impedance between a node for delivering said turn-off potential and said control terminal is smaller than the first impedance.

An embodiment provides a device configured to implement a method such as defined hereabove.

According to an embodiment, the device comprises:
another switch coupling said control terminal to a node for delivering said turn-off potential;
a capacitive element coupling said delivery node to another control terminal of said another switch; and
a resistive element and a diode, electrically in parallel between said other control terminal and a node for receiving a signal representative of said control signal.

According to an embodiment, said delivery node is defined by a conduction terminal of said switch.

According to an embodiment, the device comprises a capacitive element coupling a conduction terminal of said switch to said delivery node, and a voltage source having two terminals coupled to two terminals of the capacitive element.

According to an embodiment, the device comprises an inverter configured to receive said control signal, said reception node being defined by an output of the inverter.

According to an embodiment, the device comprises a circuit configured to output said control signal.

An embodiment provides a circuit intended to be used in a device such as defined hereabove, said circuit being configured to:
receive a signal representative of said control signal; and
implement step b) based on said control signal, said circuit being preferably monolithic, and the device further comprising another circuit configured to implement the step a).

An embodiment provides a circuit comprising a circuit such as defined hereabove and said switch.

An embodiment provides a converter comprising a device such as defined hereabove or a circuit such as defined hereabove.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, converters or converter portions are neither described nor shown, the described embodiments being compatible with usual converters.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
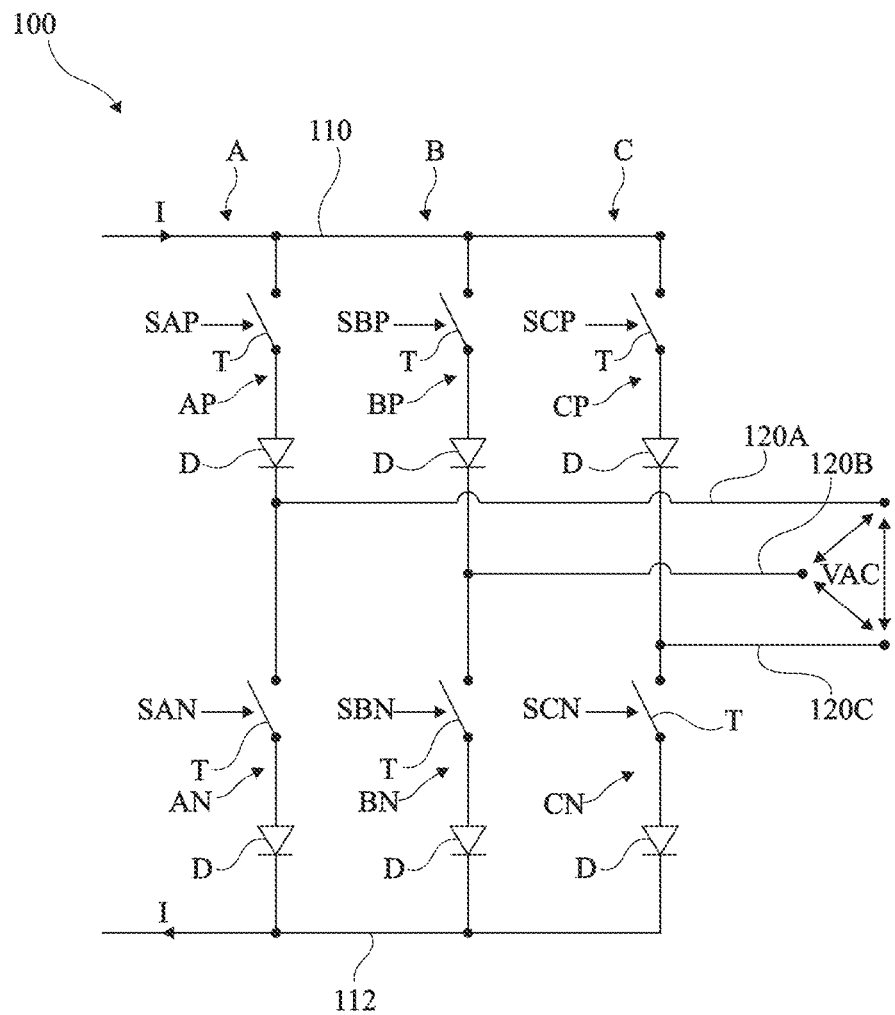
FIG. 1 partially and schematically shows an example of a converter to which the described embodiments apply.

FIG. 1 partially and schematically shows an example of a converter 100 to which described embodiments apply. However, this example is not limiting, and the embodiments described hereafter in the example of a CSI-type converter also apply to other examples of CSI converters and to other types of converter. These other types will occur to those skilled in the art in the light of the embodiments described hereafter.

In this example, the shown portion of converter 100 is powered with a current I, preferably DC, and outputs a three-phase AC voltage VAC. Current I may originate from an inductive element, not shown, internal to converter 100. Voltage VAC may be delivered across capacitors, not shown, internal to converter 100.

Converter 100 comprises input nodes 110 and 112. In the shown example, power supply current I enters through node 110 and comes out of node 112. Converter 100 comprises three branches, respectively A, B, and C, electrically in parallel between nodes 110 and 112. Each branch A, B, C comprises two half-branches, respectively AP and AN, BP and BN, CP and CN. In each branch A, B, C, one of the half-branches couples node 110 to a node 120 (120A, 120B, 120C), and the other one of the half-branches couples nodes 112 and 120. Half-branches AP, BP, and CP are located on the side of node 110, and half-branches AN, BN, and CN are located on the side of node 112. In each branch A, B, C, the half-branches are thus connected together by respective nodes 120A, 120B, 120C. Nodes 120A, 120B, 120C form output nodes between which the converter outputs three-phase voltage VAC.

Each half-branch comprises two switches, at least one of which is controlled. In the shown example, each half-branch comprises a controlled switch T and, preferably, a diode D defines a non-controlled switch. Each diode D has its anode facing the node 110 through which current I enters the shown portion of the converter.

Switches T may be any type of controlled switch capable of forming a switching cell. Preferably, switches T are N-channel MOS-type field-effect transistors. As a variant, the MOS transistors have a P channel. In other variants, switches T are of bipolar transistor type or of isolated gate bipolar transistor, IGBT, type. Each switch T may also comprise a plurality of elementary switches electrically in parallel. Preferably, the elementary switches are similar or identical. Identical here means identical to within manufacturing tolerances. The elementary switches may be MOS-type transistors (as a variant, of bipolar type). The transistors of a same switch T then have their source terminals (as a variant, their emitter terminals) connected to one another and their drain terminals (as a variant, their collector terminals) connected to one another.

In each half-branch AP, BP, and CP, switch T has a conduction terminal coupled, preferably connected, to node 110, and another conduction terminal coupled, by the diode D of the considered half-branch, to the concerned node 120. Conduction terminals of a switch means the terminals of the switch between which an electric connection is established when the switch is in the on state, for example, the drain/source or, as a variant, collector/emitter, terminals. As a variant, the positions of diode D and of transistor T may be exchanged.

Preferably, each switch T comprises a diode, not shown, coupling the conduction terminals of switch T. Such a diode is for example a diode called body diode defined by a junction between semiconductor regions of the considered switch T. This diode has its cathode facing the node 110 through which current I enters the shown portion of the converter.

Preferably, each diode D is defined by a junction between semiconductor regions of a switch, not shown. In other words, each diode D is the intrinsic diode of a switch. These switches, here called switches of diodes D, are preferably N-type MOS field-effect transistors, but may be of any type of transistor comprising a diode. In operation, the switch of each diode D is preferably turned on at the times when the diode should conduct a current, to decrease an energy loss due to a voltage drop in the diode in the on state. The method of controlling the diodes switches is not described in detail herein, the described embodiments being compatible with usual methods of controlling diode switches of a CSI-type converter.

In operation, in each half-branch AP, BP, CP, AN, BN, CN, switch T is controlled by a respective control signal SAP, SBP, SCP, SAN, SBN, SCN.

Figure 2:
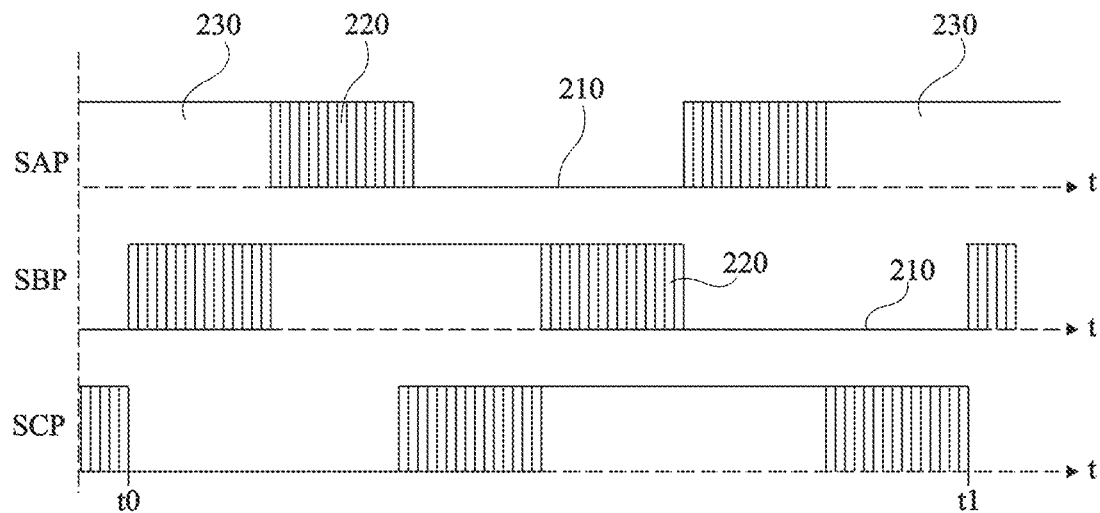
FIG. 2 very schematically shows timing diagrams of an example of control signals of three switches of the converter of FIG. 1.

FIG. 2 very schematically shows timing diagrams of an example of controls SAP, SBP, and SCP of the switches AP, BP, and CP of the converter of FIG. 1 located on the side of the input nodes 110 of current I. More particularly, an example of a control cycle between times t0 and t1 has been shown herein. The control cycle is here repeated at the frequency of the output voltage, for example, 50 Hz or 60 Hz. The specific control cycle shown herein is not limiting, the described embodiments being applicable to usual CSI-type converter control cycles. Control signals SAN, SBN, and SCN are neither described, nor shown, the described embodiments being compatible with usual cycles of control of the switches of half-branches connected to a node, such as node 112, from which the input current of a CSI-type converter comes out.

Each of control signals SAP, SBP, and SCP has a low level and a high level. In the shown example, the low level is a turn-off level or turn-off control state, of switch T. Switch turn-off control state means that the application to this switch of the control signal when it is in the turn-off control state causes the turning-off or opening of this switch. In the shown example, the high level is a turn-on level, or turn-on control state, of switch T. Switch turn-on control state means that the application to this switch of the control signal when it is in the turn-on control state causes the setting to the on state, or closing, of this switch. This is not limiting, and the low and high levels may be exchanged and respectively control the turning on and the turning off of switch T. Although each of the low and high levels shows herein has a constant or almost constant value over time t, for each of the turn-off and turn-on states, the control signal applied to the control terminal of switch T may have a time-variable potential. In an example, the high level approximately corresponds to the potential of one of the conduction terminals of switch T, here, the potential of node 110 (FIG. 1), and the low level approximately corresponds to the potential of the other one of the conduction terminals of switch T, here the potential of the concerned node 120.

For each of the half-branches, the control signal is only at the turn-off level during periods 210. In the shown example, each cycle comprises one period 210 for each half-branch. In the shown example, each period 210 has a duration equal to approximately one third of the duration of the control cycle, that is, of the cycle time of the delivered AC voltage VAC. Switch T and the concerned half-branch are then said to be inactive during this period. The periods 210 of inactivity of half-branches AP, BP, and CP follow one another cyclically, for example, in this order, the end of a period 210 of inactivity of each half-branch marking the beginning, or substantially the beginning, of the period 210 of inactivity of the next half-branch. In other words, the switches T of half-branches CP, AP, and BP are inactive in turns.

For each of the half-branches, during periods 220, the control signal exhibits halfwaves (shown by vertical hatchings) of the turn-off and turn-on levels of switch T. In the shown example, each cycle has two periods 220 for each half-branch. In this example, the end of one of periods 220 marks the beginning, or substantially the beginning, of the next inactivity period 210, and the end of inactivity period 210 marks the beginning, or substantially the beginning, of the other one of periods 220. In this example, each period 220 has a duration of approximately one sixth of that of the control cycle.

During each period 220, each halfwave corresponds to a control signal switching cycle, where the control signal is successively at the low and high levels. The switching cycles are repeated at a so-called switching frequency. At each switching cycle, a duty cycle is defined by the ratio of the duration for which the control signal remains at the high level to the duration of the switching cycle. Preferably, the duty cycle is variable and the switching frequency is constant (pulse width modulation PWM). As a variant, the switching frequency is also variable.

For each of the half-branches, the control signal is only at the turn-on level during periods 230. In the shown example, each cycle comprises one period 230 for each half-branch. In the shown example, each period 230 has a duration equal to approximately one third of the duration of the control cycle, the other two thirds of the control cycle being occupied by inactivity period 210 and switching periods 220. The periods 230 of half-branches AP, BP, and CP follow one another at each cycle, for example, in this order. Thus, the switches T of half-branches AP, BP, and CP are never all three in the off state at the same time. During each period 230, current I flows through the concerned half-branch AP, BP, CP when the others of half-branches AP, BP, and CP have their switch T in the off state. The half-branch then play a so-called free wheel role, period 230 being called free wheel period.

Figure 3:
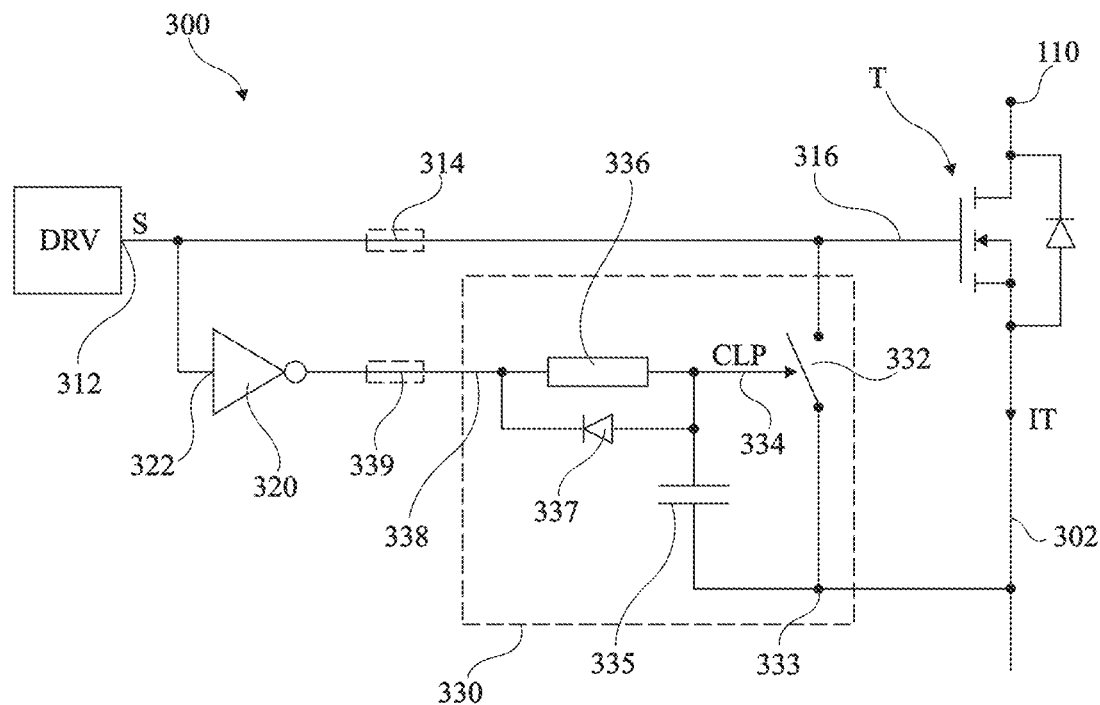
FIG. 3 schematically shows an embodiment of a switch control device and a switch controlled by this device.

FIG. 3 schematically shows an embodiment of a switch control device 300 and a switch T, such as defined hereabove, controlled by device 300. Switch T is for example that of one of the half-branches of the converter of FIG. 1. Control signal S is then formed by the concerned control signal SAP, SBP, SCP, SAN, SBN, SCN, for example, as illustrated in the example of FIG. 2. Preferably, a control device such as device 300 is provided for each of the switches T of the half-branches of the converter of FIG. 1.

Switch T, in the example shown in FIG. 3, comprises an N-channel MOS transistor, comprising an intrinsic diode having its cathode and its anode respectively connected to the drain and to the source of the transistor. For example, the transistor has its drain coupled, preferably connected, to node 110 (FIG. 1). The described embodiments apply to all types of switches capable of being used in a converter, in particular such as those described in relation with FIG. 1.

Device 300 comprises a so-called driver circuit DRV, configured to output control signal S. Circuit DRV may be any usual circuit enabling to output a control signal applied to a switch control terminal. Circuit DRV outputs control signal S on an output 312 coupled, by a link 314, to the control terminal 316 of switch T.

Preferably, device 300 further comprises an inverter 320. Inverter 320 has an input 322 coupled, preferably connected, to output 312 of circuit DRV. Preferably, inverter 320 outputs a signal at a high (respectively low) level when the inverter receives a signal at a low (respectively high) level on its input 322. The low and high levels may have different voltages at the input and at the output of inverter 320. In other words, the inverter may perform an adjustment of the voltage levels between its input and its output.

Device 300 further comprises a circuit 330. Circuit 330 comprises a switch 332, other than switch T, coupling the control terminal 316 of switch T to a node 333. More particularly, switch 332 has its conduction terminals coupled, preferably connected, respectively to control terminal 316 and to node 333. Switch 332 has a control terminal 334. Switch 332 is preferably an N-channel MOS type transistor, however, switch 332 may be of any type having an on state where it establishes an electric connection between terminal 316 and node 333 when a control signal CLP applied to its control terminals is at a first level, for example, a high level. Preferably, when control signal CLP is at a second level, for example, a low level, switch 332 is in an off state where it interrupts the electric connection between terminal 316 and node 333.

Circuit 330 further comprises a capacitive element 335 coupling node 333 to the control terminal 334 of switch 332. Capacitive element 335 may be formed of a capacitor, such as shown, and/or of a parasitic capacitor of switch 332 between its control terminal 334 and its conduction terminal connected to node 333. Such a parasitic capacitor is for example, in the case where switch 332 is an N-channel MOS transistor, located between the gate is the source of the transistor. Circuit 330 further comprises a resistive element 336 and a diode 337, electrically in parallel between control terminal 334 and a node 338. Diode 337 has its anode facing control terminal 334. Node 338 is coupled, by a link 339, to the output of inverter 320.

According to the present embodiment, node 333 is coupled to a conduction terminal 302 of switch T, here to the source of the MOS transistor forming switch T. Preferably, node 333 and terminal 302 are connected, in other words, node 333 and terminal 302 define a same node. In a variant, not shown in FIG. 3, node 333 and terminal 302 are not directly connected, but are coupled by a coupling element, wanted or parasitic, such as a resistor, an inductance, and/or a capacitor. An example of such a coupling element will be described hereafter in relation with FIG. 6.

In operation, node 338 receives a signal output by inverter 320, inverse to control signal S. When switch 332 is in the on state, the potential of node 333, that is, that of conduction terminal 302 in the present embodiment, is applied to the control terminal 316 of switch T. In this embodiment, switch T is such that, when a zero or substantially zero voltage is applied between its terminals 302 and 316, transistor T is in an off state. Circuit 330 thus turns off switch T and prevents the flowing of a current IT through switch T. In other words, the potential of node 333 is a turn-off potential of switch T.

The turning off, or clamping, of switch T by circuit 330 enables to avoid for switch T to untimely switch to the on state when control signal S is at the low level, for example, due to interference. Such a switching to the on state would risk, in particular, when the half-branch comprising switch T is in an inactivity period 210, at least partly shorting the converter output, or would risk resulting in an unwanted voltage at the converter output. Such a defect would decrease the converter efficiency, would risk decreasing the converter reliability, would risk damaging the converter, or would even risk damaging elements coupled to the converter. Interference in particular occur due to fast voltage variations across the inactive half-branch, due to the switchings in the active branches. For example, the successive charges and discharges of parasitic capacitors of the switch T of the inactive half-branch are capable of generating, between the conduction and control terminals of switch T, voltages sufficient to make switch T at least partly conductive.

Figure 4:
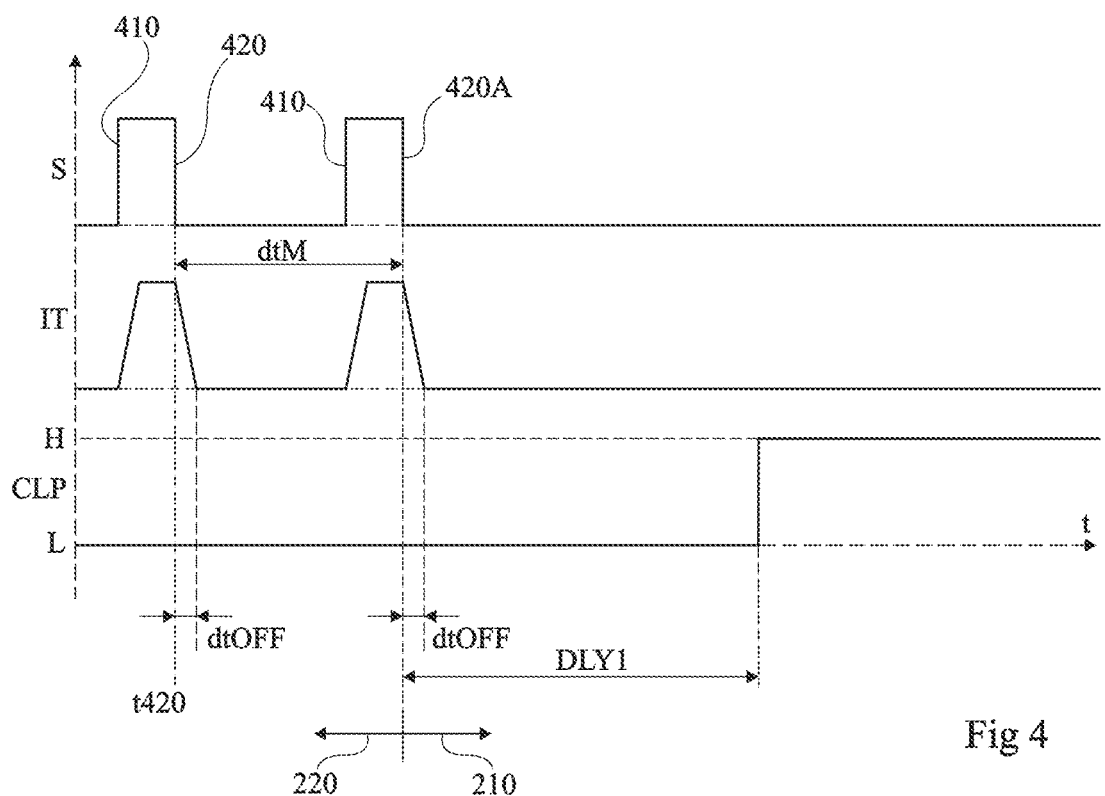
FIG. 4 shows, in simplified timing diagrams, a step of an embodiment of a method implemented by the device of FIG. 3.
Figure 5:
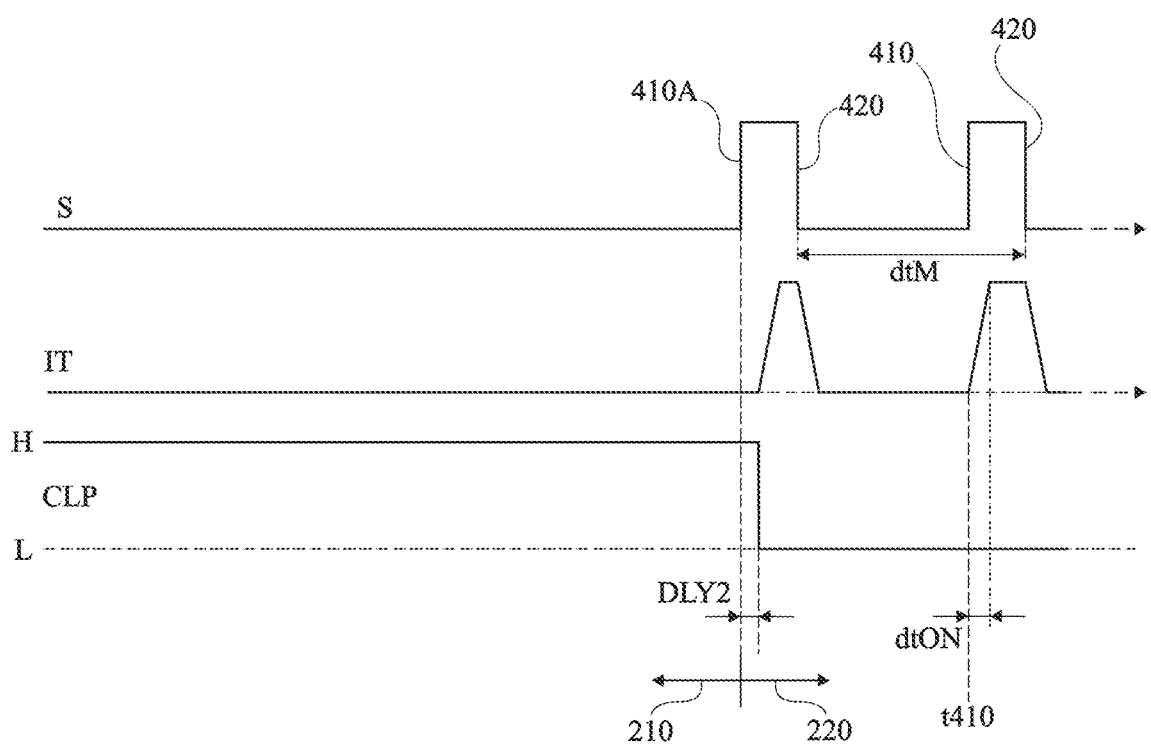
FIG. 5 shows, in simplified timing diagrams, another step of the method.

FIGS. 4 and 5 show, in simplified timing diagrams, steps of an embodiment of a method implemented by the device of FIG. 3. More particularly, they show, according to time t, control signal S, the current IT in switch T, and two levels H and L of control signal CLP respectively controlling the on and off states of switch 332. In the shown example, level H of the control signal corresponds to the values of control signal CLP higher than a turn-on threshold of switch 332, and level L corresponds to the values of control signal CLP smaller than this threshold. Control S here is of the type of the signals SAP, SBP, and SCP described hereabove in relation with FIG. 2.

The timing diagrams of FIG. 4 show the end of a switching period 220 and the beginning of an inactivity period 210 for switch T. As mentioned hereabove, control signal S exhibits square pulses during switching period 220. Two last square pulses of switching period 220 are here very schematically shown.

In the shown example, control signal S has, at the beginning of each square pulse, a rising edge 410 between the turn-off level (here, the low level) and the turn-on level (here, the high level). Control signal S has, at the end of each square pulse, a falling edge 420 between the turn-on level and the turn-off level. During at least a portion of each square pulse shown herein, switch T is on and current IT flows through switch T.

After each falling edge 420, switch T switches to the off state. However, in practice, the current in switch T is not immediately interrupted at the time t420 when edge 420 is output by circuit DRV. In practice, switch T switches to the off state, that is, reduces to zero the current IT that it conducts, within a turn-off time dtOFF from time t420 when control signal S switches to the turn-off level. Turn-off time dtOFF is for example linked to an impedance of link 314 (FIG. 3, impedance shown in dotted lines), through which control signal S is applied to control terminal 316. This impedance is substantially equivalent to a resistor and an inductance in series between circuit DRV and control terminal 316 of switch T. Turn-off time dtOFF is also coupled to the parasitic impedances such as those of the half-branches. Damped oscillations of the current, not shown, may still occur after time dtOFF has elapsed, time dtOFF thus corresponding to the time between time t420 and the time of the first reduction to zero of current IT after time t420.

Circuit 330 applies the potential of node 333 to control terminal 316, that is, clamps switch T, only after a delay DLY1 starting at time t420. In particular, the values of the resistance of resistive element 336, of the capacitance of capacitive element 335, the voltage levels output by inverter 320, and the threshold voltage of switch 332 are selected to obtain the desired delay DLY1. Delay DLY1 is longer than turn-off time dtOFF, in other words, the duration of delay DLY1 is greater than turn-off time dtOFF.

To avoid as much as possible the above-mentioned untimely turning-on, one might have been enticed to using, instead of the inverter 320 and of the circuit 330 of the device of FIG. 3, a circuit enabling to apply the potential of conduction terminal 302 to control terminal 316 with no delay after the switching of the control signal to the turn-off level, or with as short a delay as possible. However, as compared with such a clamping circuit with no delay or with as short a delay as possible the fact of providing delay DLY1 enables to limit or to avoid the risk, in an active period, that is, a switching period 220 or, more particularly, in a free wheel period 230, for interference to trigger the application of the potential of conduction terminal 302 to control terminal 316. This would cause an untimely turning off of switch T and would for example risk placing in open circuit the input of current I in converter 100, that is, blocking all the flow paths of current I in the converter. Such an open circuit would decrease the converter efficiency, and would risk decreasing the converter reliability, would risk damaging the converter, or would even risk damaging elements coupled to the converter. In particular, the fact of providing a delay DLY1 longer than turn-off time dtOFF enables to decrease such risks for interference linked to the turning off of the switches.

Preferably, as shown, delay DLY1 is longer than a switching cycle time dtM, in other words, a cycle time of the halfwaves of switching periods 220. For example, delay DLY1 is equal to 150% of the time of switching cycles dtM. Thus, circuit 330 does not clamp switch T during a switching period. A clamping of switch T only occurs after an edge 420A which, among edges 420, marks the beginning of inactivity period 210. This enables to avoid any risk of untimely clamping of switch T in a switching period 220.

Preferably, delay DLY1 is shorter than 1%, preferably shorter than 0.2%, more preferably shorter than 0.05% of the duration of inactivity periods 210. Delay DLY1 is preferably shorter than approximately 100 μs, preferably shorter than 67 μs, more preferably smaller than 13 μs, more preferably still smaller than approximately 3.3 μs, for example, equal to approximately 3 μs. These values of delay DLY1 are more particularly preferred for a frequency of the AC voltage equal to 50 Hz and a control mode such as that of FIG. 2. Delay DLY1 is more preferably equal to the smallest of the values between approximately 3 μs and approximately 150% of cycle time dtM. This selection of a value thus much smaller than the duration of inactivity period 210 is advantageous in particular when the variations of the voltage across the inactive half-branch progressively increase from the beginning of inactivity period 210. Delay DLY1 thus is, preferably, such that, during delay DLY1, the amplitude of the voltage variations across the inactive half-branch remains sufficiently small to avoid causing an untimely setting to the on state of inactive transistor T.

The timing diagrams of FIG. 5 show the end of an inactivity period 210 and the beginning of a switching period 220 of switch T. Two first square pulses of switching period 220 are here very schematically shown. Inactivity period 210 ends at the time when an edge 410A among edges 410 is generated by circuit DRV.

After edge 410A, the application to control terminal 316 of the potential of node 333 is interrupted after a delay DLY2. In other words, switch T is unclamped after delay DLY2. Delay DLY2 corresponds to the time taken by signal CLP to reach its level L for controlling the turning off of switch 332, by the discharge of capacitive element 335 through diode 337, according to the output voltage level of inverter 320. Delay DLY2 is shorter than delay DLY1, in other words, the duration of delay DLY2 is shorter than that of delay DLY1.

Once switch T has been unclamped, switch T can turn on. Thus, after each rising edge 410 located outside of the periods of application of the potential of node 333 to control terminal 316, switch T switches to the on state. However, in practice, switch T is not immediately on from as soon as time t410 when edge 410 is output by circuit DRV. In practice, switch T switches to the on state, that is, enables the flowing of all the input current I, within a turn-on time dtON from time t410 when the control signal switches to the turn-on level. The current may exhibit oscillations after time dtON. Time dtON then corresponds to the time between time t410 and the moment of the first time when current IT crosses the value of current I after time t410.

Preferably, delay DLY2 is shorter than turn-on time dtON, preferably shorter than 2% of switching cycle time dtM, more preferably shorter than 0.8%, more preferably still shorter than 0.2% of switching cycle time dtM. Preferably, delay DLY2 is shorter than approximately 1 μs, more preferably shorter than 400 ns, more preferably shorter than 100 ns, for example, in the order of 30 ns. These values of delay DLY2 are more particularly preferred for a 50-kHz switching frequency, that is, a switching cycle time of 20 μs. This enables to start the switching substantially from as soon as the beginning of the first square pulse of switching period 220. It is in particular avoided for switch T to remain off during one or a plurality of the square pulses of the beginning of switching period 220, which would adversely affect the quality of the voltage output by the converter.

Preferably, delay DLY2 is longer than 0.01% of switching cycle time dtM, preferably longer than 0.05% of switching cycle time dtM, more preferably longer than 0.1% of switching cycle time dtM. Thus, delay DLY2 is preferably in the range from 0.01% to 2% of switching cycle time dtM. Preferably, delay DLY2 is longer than 2 ns, preferably longer than 10 ns, more preferably longer than 20 ns, for example, in the order of 20 ns. These values of delay DLY2 are more particularly preferred for a 50-kHz switching frequency, that is, a switching cycle time of 20 μs. This may be obtained, for example, by a resistor in series with diode 337 (FIG. 3), or also, for example, by the selection of diode 337. This enables to filter possible interference and to avoid for the application of the clamping potential to be momentarily interrupted during inactivity periods 210. In a variant, delay DLY2 may even be longer than turn-on time dtON.

A specific embodiment of a device 300 configured to implement the method of FIGS. 4 and 5 has been described hereabove. This embodiment is not limiting.

Thus, inverter 320 may be replaced with any circuit configured to receive control signal S and deliver a signal representative of control signal S on its output. It will be within the abilities of those skilled in the art to adapt the circuit 330 of FIG. 3 to apply a clamping potential as described hereabove in relation with FIGS. 4 and 5 based on the signal representative of control S. This representative signal is then received by the circuit 330 thus adapted, on an input node such as node 338, which thus defines a node of reception of the signal representative of control S. In particular, in a variant, inverter 320 is omitted.

In device 300, circuit 330 may be replaced with any circuit capable of applying a clamping potential in a way similar or identical to that described hereabove, based on a signal representative of control S.

However, the circuit 330 of FIG. 3 has the advantage of being particularly simple, that is, simpler than usual circuits forming the DRV circuit. This enables to easily place circuit 330 close to switch T. Close here means that when switch 332 is on, the impedance between turn-off potential delivery node 333 and control terminal 316 is smaller than the impedance of link 314, preferably smaller than 0.1 time the impedance of link 314. In other words, circuit 330 is closer to switch T than circuit DRV. As compared with a variant where circuit 330 is not closer than circuit DRV, this enables to limit the risk for interference to momentarily unclamp switch T. This is more particularly advantageous when switch T comprises a plurality of switches in parallel. A circuit identical or similar to circuit 330 may then be placed at closest to each switch forming switch T, these circuits all receiving the same control signal S on a common node 338.

Further, resistive element 336 and capacitive element 335 form a low-pass filter. Thereby, it may be provided for the link 339 between inverter 320 (or another circuit for outputting a signal representative of control S) and for circuit 330 to have an impedance (shown in dotted lines in FIG. 3), greater than the impedance between node 333 and terminal 316 when switch 332 is on. The fact of providing such an impedance of link 339 enables to ease the positioning of inverter 320 in the device.

According to an embodiment, circuit 330 is monolithic, that is, the elements of circuit 330 are all located in a same integrated circuit electronic die. Such a die is defined by a semiconductor wafer portion and electronic circuits located inside and on top of the wafer. The die is preferably located in an integrated circuit package. Such a package is defined by a package, preferably tight, containing the die, and comprising connection areas and/or conductive pins. The areas and/or pins are electrically coupled, preferably connected, to the die and intended to be electrically coupled, preferably connected, to other circuits. Preferably, the areas and/or pins are intended to be welded to a printed circuit board PCB. More preferably, the assembly of circuit 330 and of switch T is monolithic.

Figure 6:
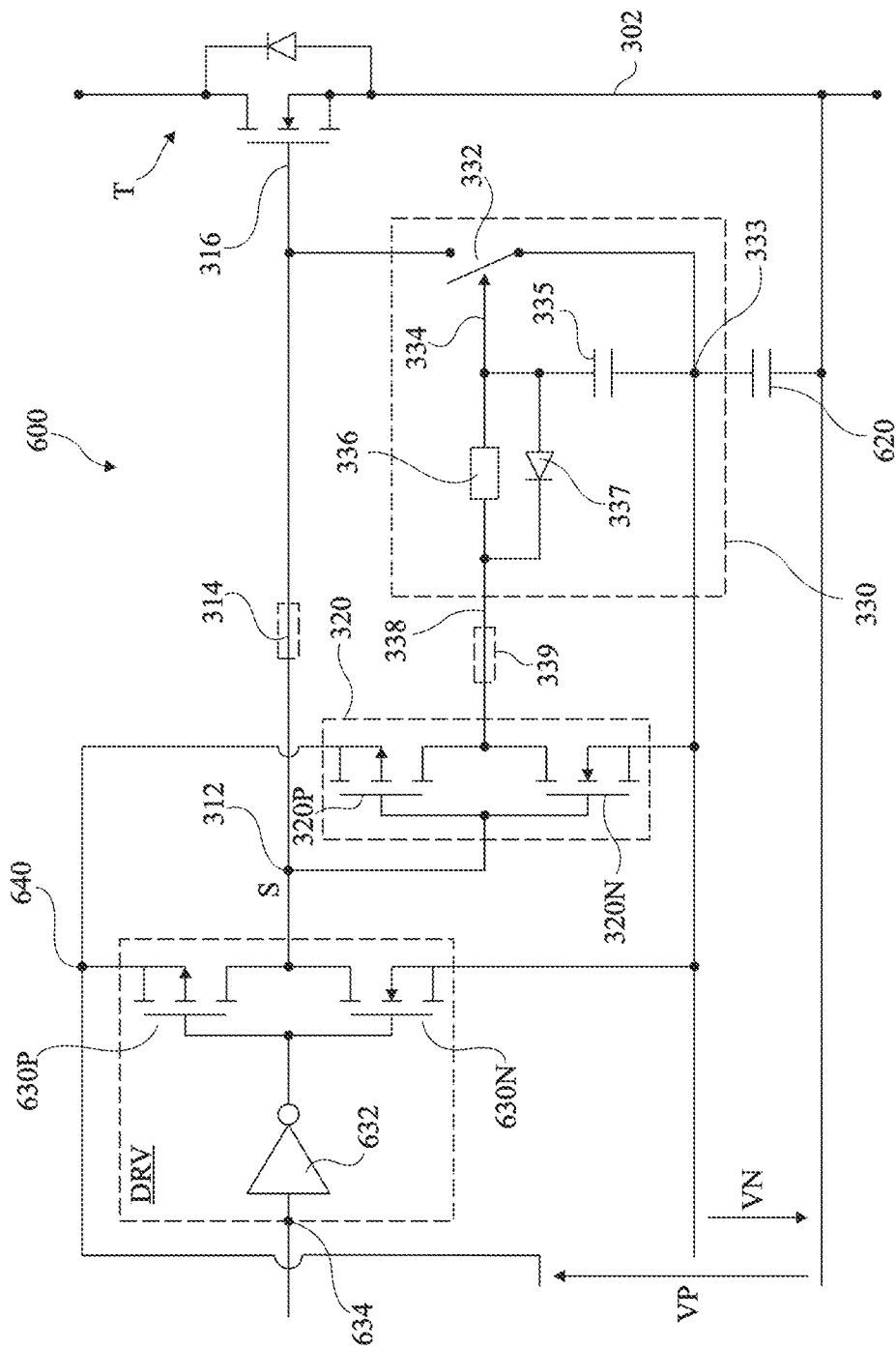
FIG. 6 schematically shows another embodiment of a switch control device and a switch controlled by this device.

FIG. 6 schematically shows another embodiment of a switch control device 600 and a switch T controlled by device 600.

Device 600 comprises elements identical or similar to those of the device 300 of FIG. 3, arranged identically or similarly. Only the differences are highlighted hereafter. Device 600 differs from the device 300 of FIG. 3 mainly in that turn-off potential delivery node 333 is not directly connected to the conduction terminal 302 of switch T, and in that a capacitive element 620, preferably, a capacitor, couples node 333 to conduction terminal 302. A voltage source has two terminals respectively coupled to terminal 302 and to node 333, that is, across capacitive element 620, and applies a voltage VN between terminal 302 and node 333. In the shown example where switch T is an N-channel MOS-type transistor and where terminal 302 is the transistor source, voltage VN is positive, which enables to obtain, on node 333, a transistor turn-off potential lower than the transistor source potential.

In the shown example, circuit DRV comprises a P-channel MOS-type transistor 630P and an N-channel MOS-type transistor 630N, inverter-assembled. In other words, the gates of transistors 630P and 630N are coupled, preferably connected, to each other, and the drains of transistors 630P and 630N are coupled, preferably connected, to each other. The gates of transistors 630P and 630N are coupled, preferably connected, to an output of an inverter 632 having an input 634. Input 634 forms an input of circuit DRV. The drains of transistors 630P and 630N are coupled, preferably connected, to output 312 of circuit DRV. In operation, the control signal S output by circuit DRV is a function of a signal applied to input 634.

In the shown example, inverter 320 comprises a P-channel MOS-type transistor 320P and an N-channel MOS-type transistor 320N, inverter-assembled. In other words, the gates of transistors 320P and 320N are coupled, preferably connected, to each other, and the drains of transistors 320P and 320N are coupled, preferably connected, to each other. The gates of transistors 320P and 320N are coupled, preferably connected, to output 312 of circuit DRV.

In the shown example, the sources of transistors 320P and 630P are coupled, preferably connected, to a node 640. The sources of transistors 320N and 630N are coupled, preferably connected, to the node 333 of application of the turn-off potential. A voltage source applies a voltage VP between node 640 and terminal 302. In other words, circuit DRV and inverter 320 are powered in parallel between nodes 640 and 333 with a voltage equal to the sum of voltages VP and VN.

The device 600 thus obtained advantageously enables control signal S to be bipolar, that is, the turn-off level exhibited by control signal S is a potential level different from that of the source of the transistor forming switch T. In the shown example, where switch T comprises an N-channel MOS-type transistor, the level, exhibited by control signal S, for turning off switch T is a potential level smaller than that of the source of this N-channel MOS transistor. As compared with known switch control methods, this operating mode enables to improve the reliability of the converter.

Although a specific way of powering circuit DRV and inverter 320 has been described hereabove in relation with FIG. 6, the inverter 320 of the embodiments of FIGS. 3 and 6 as well as the circuit DRV of the embodiment of FIG. 6 are compatible with any circuit for powering such a circuit DRV and/or an inverter. In particular, inverter 320 may be powered with a power source different from that which powers circuit DRV. For example, in a variant of the embodiment of FIG. 6, the source of transistor 320P may be coupled to node 640 by a circuit performing a potential adjustment, and/or the source of transistor 320N and/or the source of transistor 630N may be coupled to node 333 by a circuit performing a potential adjustment. Such a potential adjustment circuit may comprise a Zener-type diode and a resistor in series or, for example, a linear voltage regulator, for example, of low drop-out, LDO, type.

Various embodiments and variants have been described. It will be understood by those skilled in the art that certain features of these various embodiments and variations may be combined and other variations will occur to those skilled in the art.

In particular, the embodiments are not limited to the above-described examples of rising and falling edges of the control signal S corresponding to substantially instantaneous or quasi-instantaneous switchings with respect to times dtON and dtOFF, preferably between levels remaining constant or substantially constant between edges. The described embodiments are applicable to any type of switching between turn-off and turn-on control states of switch T and/or between turn-on and turn-off control states of switch T. In particular, at each switching, the control signal may pause one or a plurality of successive times at intermediate values separated by substantially instantaneous edges. In such a case, call switching time between states of control signal S the time at which control signal S crosses, in the rising or falling direction, a threshold level. The threshold level defines a separation between levels of control signal S which control states defined as clamped and levels of control signals S which control states defined as conductive. As an example, in the case where switch T comprises a field-effect transistor, the threshold level corresponds to the threshold voltage of the transistor, that is, the voltage between the gate and the source for which a conduction channel appears between the drain and the source.

Further, although the above-described embodiments have been described in their application to a CSI-type converter, the embodiments apply to any converter, preferably to converters where switches are inactive during an inactivity period having a duration of a plurality of times of a switching cycle time, more preferably of more than 100 times the switching cycle time. Thus, the converter may for example be:

a voltage source inverter, VSI;

a diode-clamped neutral point multilevel inverter, called NPC (neutral point clamped);

a transistor-clamped neutral point multilevel inverter, called ANPC (active neutral point clamped); or a multilevel bidirectional switch-clamped neutral point inverter, called T-type inverter.

More particularly, in these converters, the control method preferably applies to one or a plurality of switches having switching periods and inactivity periods of the type of those described hereabove in relation with FIG. 2.

Finally, the practical implementation of the embodiments and variants described herein is within the capabilities of those skilled in the art based on the functional indications provided hereinabove.

The invention claimed is:

1. Method of controlling a switch, said method comprising steps of:
  a) applying a control signal to a control terminal of the switch, said control signal exhibiting at least one first switching between a switch turn-on control state and a switch turn-off control state, the switch switching to an off state within a turn-off time from the first switching; and
  b) applying a switch turn-off potential to said control terminal after a first delay starting at said first switching, the first delay being longer than the turn-off time, wherein:

the first switching marks a beginning of a first period during which said control signal is only in the turn-off control state;

a second period comprises alternations of states of control of the turning off and the turning on of the switch;

the first delay is longer than a cycle time of the alternations;

said control signal exhibits, during said application of the turn-off potential, at least one second switching between the turn-off control state and the turn-on control state; and said application of the turn-off potential is interrupted within a second delay starting at said second switching and shorter than the first delay.

2. Method according to claim 1, wherein the first switching forms an edge between a turn-on level and a turn-off level.

3. Method according to claim 1, wherein the first delay is shorter than 1% of a duration of the first period.

4. Method according to claim 3, wherein the first delay is shorter than 0.2% of a duration of the first period.

5. Method according to claim 3, wherein the first delay is shorter than 0.05% of the first period.

6. Method according to claim 1, wherein:

said control signal has, outside of said application of the turn-off potential, a third switching between the turn-off control state and the turn-on control state, the switch switching to an on state within a turn-on time from the third switching; and the second delay is shorter than the turn-on time.

7. Method according to claim 1, wherein:

said application of said control signal is performed by means of a link having a first impedance; and during the implementation of said application of the turn-off potential, a second impedance between a node for delivering said turn-off potential and said control terminal is smaller than the first impedance.

8. Method according to claim 1, wherein the second delay is shorter than approximately 1 µs.

9. Device for controlling a switch, said device, comprising:

a circuit coupled to the switch, the circuit comprising:

another switch coupling a control terminal to a node for delivering a turn-off potential;

a capacitive element coupling said delivery node to another control terminal of said another switch; and a resistive element and a diode electrically in parallel between said another control terminal and a node of reception of a signal representative of a control signal, wherein the circuit is configured to:

a) apply the control signal to the control terminal of the switch, said control signal exhibiting at least one first switching between a switch turn-on control state and a switch turn-off control state, the switch switching to an off state within a turn-off time from the first switching; and b) apply the switch turn-off potential to said control terminal after a first delay starting at said first switching, the first delay being longer than the turn-off time, wherein:

the first switching marks a beginning of a first period during which said control signal is only in the turn-off control state;

a second period comprises alternations of states of control of the turning off and the turning on of the switch;

the first delay is longer than a cycle time of the alternations;

said control signal exhibits, during said application of the turn-off potential, at least one second switching between the turn-off control state and the turn-on control state; and said application of the turn-off potential is interrupted within a second delay starting at said second switching and shorter than the first delay.

10. Device according to claim 9, wherein said delivery node is defined by a conduction terminal of said switch.

11. Device according to claim 9, comprising a capacitive element coupling a conduction terminal of said switch to said delivery node, and a voltage source having two terminals coupled to two terminals of the capacitive element.

12. Device according to claim 9, comprising an inverter configured to receive said control signal, said reception node being defined by an output of the inverter.

13. Device according to claim 9, comprising a circuit configured to output said control signal.

14. Device according to claim 9, wherein the device further comprises sub-circuitry, sub-circuitry is configured to:

receive a signal representative of said control signal; and implement step b) based on said control signal, said sub-circuitry is monolithic, and the device further comprises another sub-circuitry configured to implement step a).

15. Device according to claim 14, wherein the device is a converter.

16. Device according to claim 9, wherein the device is a converter.

* * * * *